900

United States Patent
O'Grady

(10) Patent No.: US 6,170,561 B1
(45) Date of Patent: Jan. 9, 2001

(54) HEAT ABSORBENT DEVICE FOR BACKUP COOLING

(76) Inventor: Mark O'Grady, 2109 Pine St., San Francisco, CA (US) 94115

( * ) Notice: Under 35 U.S.C. 154(b), the term of this patent shall be extended for 0 days.

(21) Appl. No.: 09/396,554

(22) Filed: Sep. 8, 1999

(51) Int. Cl.[7] ................................. F24H 9/06; F28F 3/12
(52) U.S. Cl. .............................. 165/53; 165/47; 165/168; 165/49; 165/10 A
(58) Field of Search ............................ 165/53, 47, 10 A, 165/168, 49

(56) References Cited

U.S. PATENT DOCUMENTS

| 3,743,782 | * | 7/1973 | Laing ................................. 165/10 A |
| 4,388,963 | * | 6/1983 | Campbell ........................... 165/10 A |
| 4,683,941 | * | 8/1987 | Timmer et al. ......................... 165/49 |
| 5,042,570 | * | 8/1991 | Schmitt-Raiser et al. ............. 165/53 |
| 5,263,538 | * | 11/1993 | Amidieu et al. ..................... 165/171 |
| 5,513,696 | * | 5/1996 | Baer ....................................... 165/49 |
| 5,609,200 | * | 3/1997 | Harrison ........................... 165/104.19 |
| 5,632,327 | * | 5/1997 | Andersson .............................. 165/53 |

FOREIGN PATENT DOCUMENTS

951956 * 8/1956 (DE) ....................................... 165/53

* cited by examiner

Primary Examiner—Ira S. Lazarus
Assistant Examiner—Tho Duong
(74) Attorney, Agent, or Firm—Jack Lo

(57) ABSTRACT

A heat absorbent device is comprised of a container filled with a phase change material selected to melt at about 75° F. It is arranged to be installed in a room with business critical electronics equipment that requires constant cooling by a cooling system, typically, to about 72° F. In some embodiments, the container is comprised of a container for attaching to a T-rail of a ceiling tile system. In another embodiment, the container is comprised of a container with hooks for attaching to holes on computer cabinets. In yet another embodiment, the container is comprised of a ceiling tile with a plurality of individually sealed cells containing the phase change material. In the event of a cooling system failure and rapidly rising room temperature, the phase change material will begin absorbing heat and cooling the room when the room temperature has reached its melting point. Without the heat absorbent device, an exemplar equipment room with about 35 W/ft$^2$ heat production will reach an equipment failure temperature of 120° F. in about 15 minutes. With enough heat absorbent devices providing about 500 ml/ft$^2$ of a 430 J/ml phase change material, temperature rise is slowed enough to delay equipment failure by an additional 50 minutes, which may be enough for repairing the cooling system or shutting down the equipment.

5 Claims, 4 Drawing Sheets

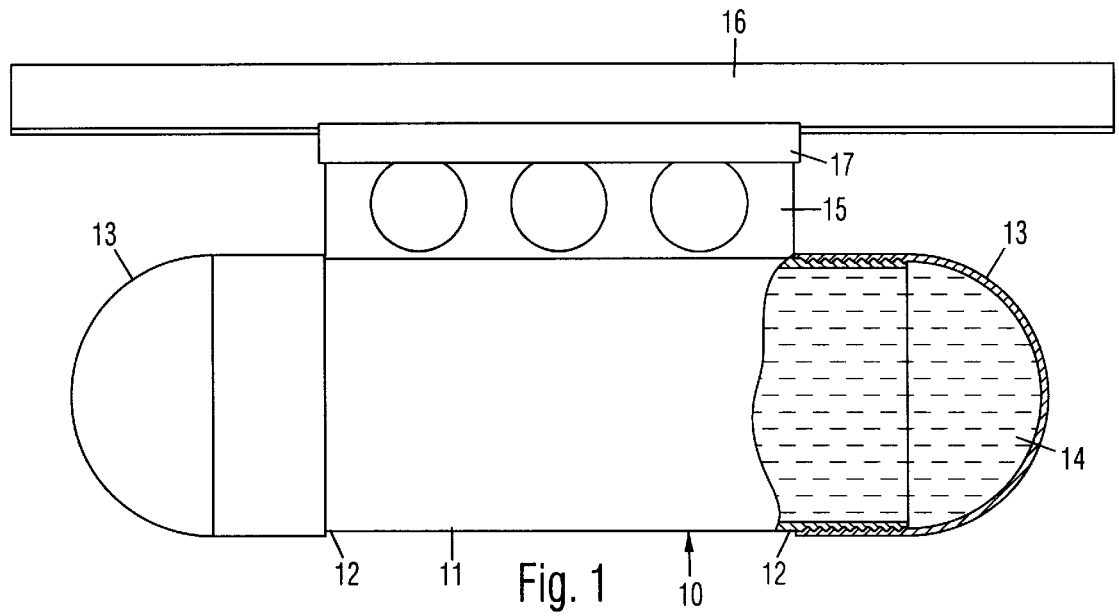
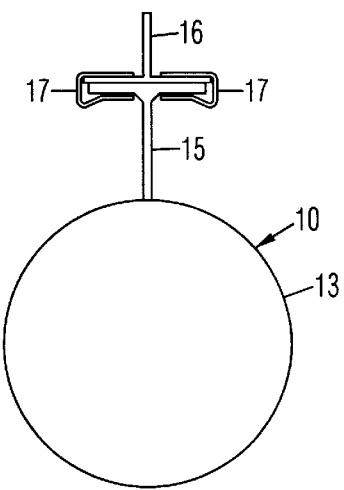

HEAT ABSORBENT DEVICE FOR BACKUP COOLING

BACKGROUND OF THE INVENTION

1. Field of the Invention

This invention relates generally to heat absorbent devices for passive cooling and heating.

2. Prior Art

Many large businesses have critical operations rooms that house information technology systems and equipment essential for conducting business. Examples of critical operations rooms include data centers, call centers, LAN, WAN, file server, hub, switch, and network rooms. Such rooms are filled with heat-generating electronic equipment, so that they must be cooled at all times. In high rise commercial buildings, cooling is primarily provided by base-building cooling systems. Critical operations rooms are typically cooled by supplemental cooling systems which are operated 24 hours a day. However, base-building and supplemental cooling systems are both dependent on the same electrical, mechanical, and plumbing systems of the building. In the event of a building electrical or plumbing system failure, both cooling systems will also fail. Without cooling, rapid heat buildup in critical operations rooms may cause equipment overheating and failure in about 15 minutes, which may result in serious business consequences.

The risk of cooling system failure can be reduced by using backup systems, such as redundant cooling systems, uninterruptable power supplies, and power generators. However, these backup systems are expensive to implement, and are still susceptible to electrical, plumbing, or mechanical failure. Without a backup system, two options are available in the event of a cooling system failure: the first is to repair the cooling system or to provide temporary cooling, such as opening doors or adding portable air conditioners; the second is to shut down the equipment in the critical operations room before they fail from overheating. In either case, the key element in preventing equipment overheating is time.

Phase change materials are known to be usable for absorbing solar heat in the day and releasing it at night for heating a building. A heat absorbing panel disclosed U.S. Pat. No. 4,178,727 to Prusinski et al. is comprised of a hollow panel filled with a heat absorbing material. The panel is usable as a ceiling tile or floor tile for passive heating or cooling. However, the panel design does not address retrofit into conventional ceiling grid systems. Its design does not take into account weight limitations and the leak resistant durability necessary to withstand periodical removal and handling for the continual maintenance and upgrade work inherent in critical operations rooms. In addition, its design does not account for panel penetration by sprinkler heads, smoke detectors and other critical operations room support devices that drop below the ceiling plane.

OBJECTS OF THE INVENTION

Accordingly, objects of the present heat absorbent device are:

- to provide backup cooling in a critical operations room during cooling system failure for providing time to repair the cooling system or shut down the equipment;
- to cool the room long enough for cooling system repair or equipment shutdown;
- to be suitable for mounting on different types of structures in a room;
- to be inexpensive and easy to install; and
- to be installable without reducing the usable floor area in a room.

Further objects of the present invention will become apparent from a consideration of the drawings and ensuing description.

BRIEF SUMMARY OF THE INVENTION

A heat absorbent device is comprised of a container filled with a phase change material selected to melt at about 75° F. It is arranged to be installed in a room with business critical electronics equipment that requires constant cooling by a cooling system, typically, to about 72° F. In some embodiments, the container is comprised of a container for attaching to a T-rail of a ceiling tile system. In another embodiment, the container is comprised of a container with hooks for attaching to holes on computer cabinets. In yet another embodiment, the container is comprised of a ceiling tile with a plurality of individually sealed cells containing the phase change material. In the event of a cooling system failure and rapidly rising room temperature, the phase change material will begin absorbing heat and cooling the room when the room temperature has reached its melting point. Without the heat absorbent device, an exemplar equipment room with about 35 W/ft$^2$ heat production will reach an equipment failure temperature of 120° F. in about 15 minutes. With enough heat absorbent devices providing about 500 ml/ft$^2$ of a 430 J/ml phase change material, temperature rise is slowed enough to delay equipment failure by an additional 50 minutes, which may be enough for repairing the cooling system or shutting down the equipment.

BRIEF DESCRIPTION OF THE SEVERAL VIEWS OF THE DRAWING

FIG. 1 is a side partial cutaway view of a first embodiment of the present heat absorbent device.

FIG. 2 is an end view of the heat absorbent device of FIG. 1.

---

DRAWING REFERFENCE NUMERALS

Figure 3:
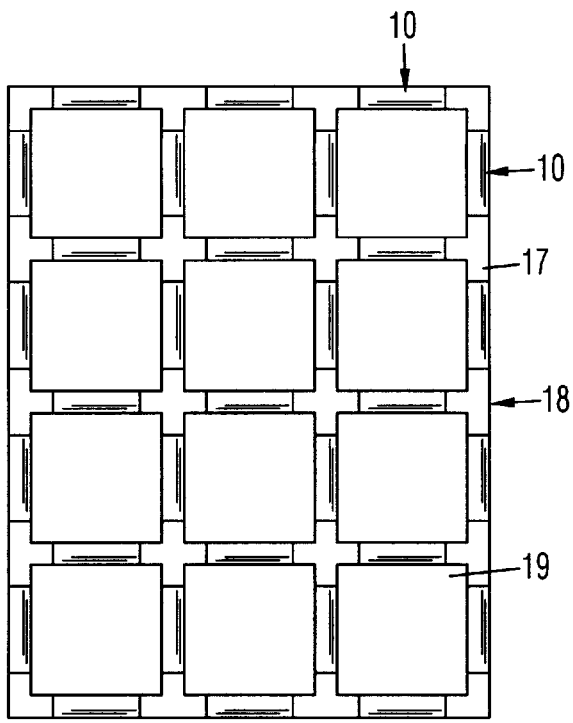
FIG. 3 is a bottom view of a plurality of heat absorbent devices attached to a first ceiling.

| | |
|---|---|
| 10. Heat Absorbent Device | 11. Container |
| 12. Ends | 13. End Caps |
| 14. Phase Change Material | 15. T-Bar |
| 16. T-Rail | 17. Clips |
| 18. Ceiling Tile System | 19. Tile |
| 20. Ceiling Tile System | 21. Tile |
| 22. Heat Absorbent Device | 23. T-Bar |
| 24. Bracket | 25. Slot |
| 26. Screw | 27. Heat Absorbent Device |
| 28. Container | 29. End Caps |
| 30. Pegs | 31. Holes |

-continued

DRAWING REFERFENCE NUMERALS

| 32. Mounting Rail | 33. Heat Absorbent Device |
| 34. Tile | 35. Chambers |

DETAILED DESCRIPTION OF THE INVENTION

FIGS. 1–2

A first embodiment of a heat absorbent device 10 is shown in a side view in FIG. 1 and an end view in FIG. 2. It is comprised of a container 11 that includes watertight end caps 13 screwed onto threaded opposite ends 12. Instead of threads, end caps 13 may be attached by other methods, such as gluing or welding, or they may be integral with container 11. A phase change material 14, such as a stripped ultra coconut fatty acid, is received in container 11. A T-bar 15 is attached longitudinally along container 11.

In most commercial buildings, a ceiling tile system is comprised of acoustic tiles supported on a grid of T-rails each in the shape of an inverted "T". The heat absorbent device is for being removably attached under a T-rail 16 of a conventional ceiling tile system by clips 17 attached to opposite sides of T-bar 15. Container 11 is preferably made of an alloy or polymer. In this example, container 11 is about 2 inches in diameter and 23 inches long overall, and contains about 1150 ml of a 430 J/ml phase change material that melts at about 75° F. Alternatively, container 11 may have other dimensions or be of another shape, such as a rectangular box, a bladder, etc. A different amount of phase change material may be provided. Another phase change material with a different heat absorption capacity may be used. In addition to T-rails, this embodiment of the heat absorbent device can be mounted on other types of ceiling grid tile support structures.

FIGS. 3–4

Heat absorbent device 10 is for mounting to the ceiling, where the air is hottest in a room to provide the most efficient cooling. The ceiling mounting does not alter the room or take up floor space. In an exemplar installation in FIG. 3, one heat absorbent device 10 is shown attached to each section of a T-rail 17 of an industry standard ceiling tile system 18 with 2 feet×2 feet tiles 19. In the event of a cooling system failure, backup cooling is provided by heat absorbent devices 10 for slowing the rise of room temperature and providing additional time for repairing the cooling system or shutting down equipment. The additional time before reaching the equipment failure temperature of about 120° F. is the time required for converting all of the phase change material from solid to liquid. The time in seconds is calculated according to the following formula:

$$Sec = \frac{0.5\,M \times 430}{W}$$

where 0.5 M is the safety-factor-adjusted volume of phase change material in ml/ft$^2$, W is heat production in W/ft$^2$, and 430 is a constant in J/ml for the heat capacity of the selected phase change material.

Given the 31 heat absorbent devices 10 shown in FIG. 3, a total volume of 35,560 ml of phase change material is provided for the 48 ft$^2$ ceiling, for an average of 742 ml/ft$^2$. Assuming an average of 35 W/ft$^2$ heat production in a typical critical operations room, the delay before reaching the equipment failure temperature of about 120° F. is about 76 minutes, which may be enough for repairing the cooling system, or at least shutting down the equipment to prevent irreparable damage.

Figure 4:
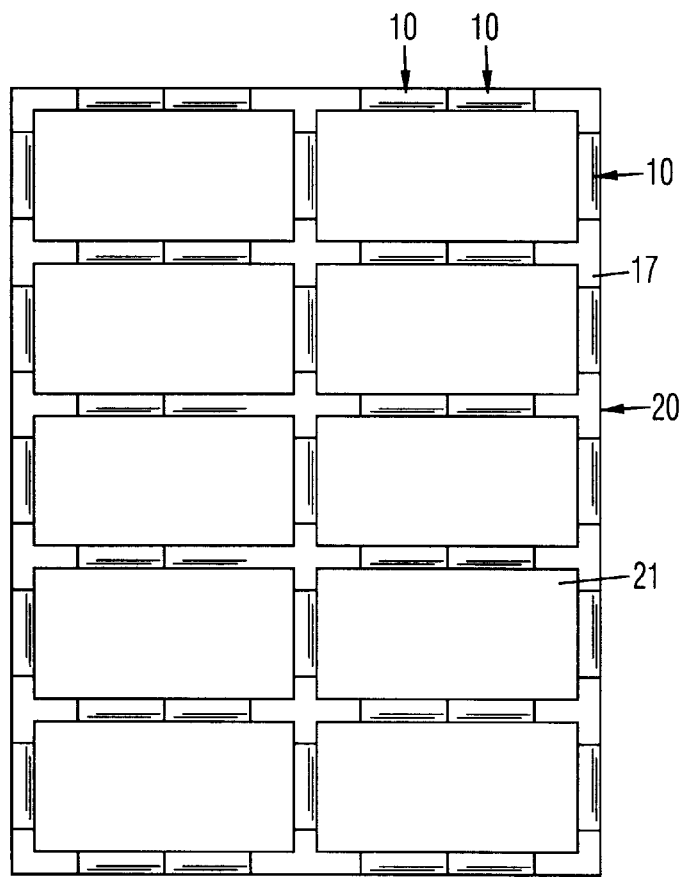
FIG. 4 is a bottom view of a plurality of heat absorbent devices attached to a second ceiling.

In another exemplar installation in FIG. 4, a plurality of heat absorbent devices 10 are shown attached to another industry standard ceiling system 20 with 2 feet×4 feet tiles 21. One heat absorbent device 10 is attached to each short section of a T-rail 17, and two heat absorbent devices 10 are attached to each long section of T-rail 17. Given the 39 heat absorbent devices 10 shown in FIG. 4, a total volume of 44,850 ml of phase change material is provided for the 80 ft$^2$ ceiling, for an average of 560 ml/ft$^2$. Assuming an average of 35 W/ft$^2$ heat production in a typical critical operations room, the additional time before reaching the equipment failure temperature of about 120° F. is about 57 minutes, which may still be enough for repairing the cooling system, or at least shutting down the equipment to prevent irreparable damage.

FIGS. 5–7

Figure 5:
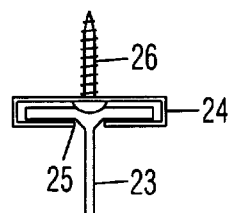
FIG. 5 is an end view of a second embodiment of the heat absorbent device.

A second embodiment of a heat absorbent device 22 is shown in an end view in FIG. 5. It is the same as the one in FIG. 1, except that a T-bar 23 is slid into an elongated bracket 24 with a longitudinal slot 25 for mounting to virtually any structure or surface with screws 26 extending through bracket 24.

Figure 6:
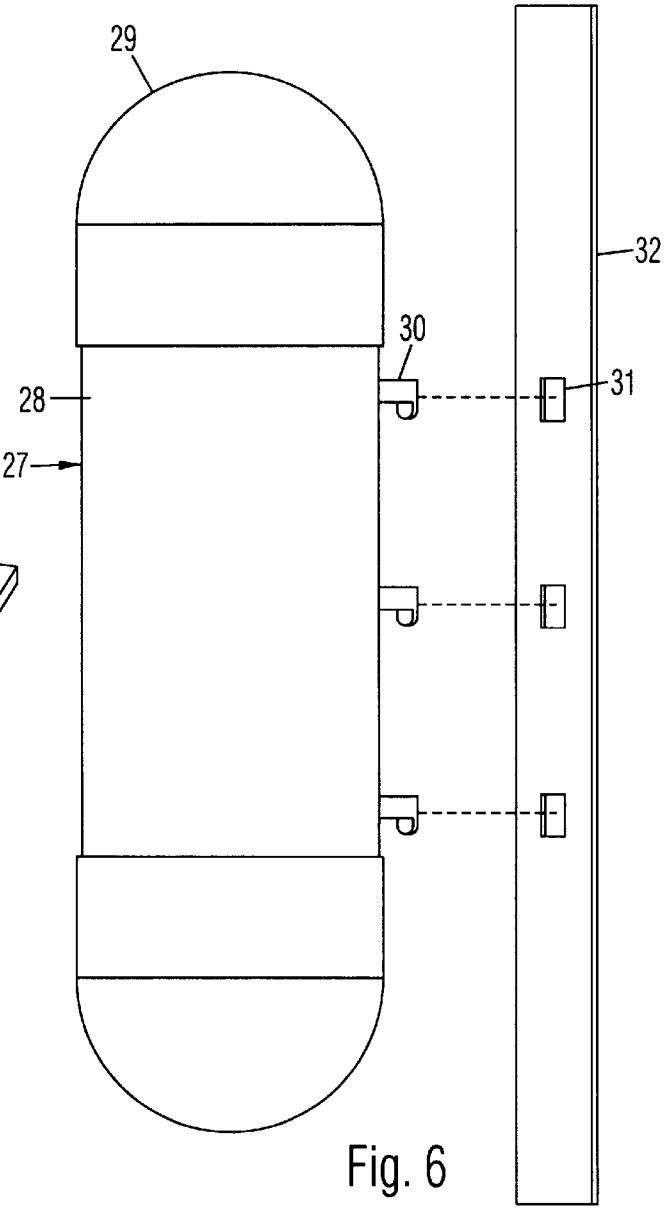
FIG. 6 is a side perspective view of a third embodiment of the heat absorbent device.

A third embodiment of a heat absorbent device 27 is shown in a side perspective view in FIG. 6. It is comprised of a container 28 that includes end caps 29, and containing a phase change material. L-shaped pegs 30 extending from container 28 are for engaging holes 31 on a mounting rail 32 of a conventional computer cabinet (not shown).

Figure 7:
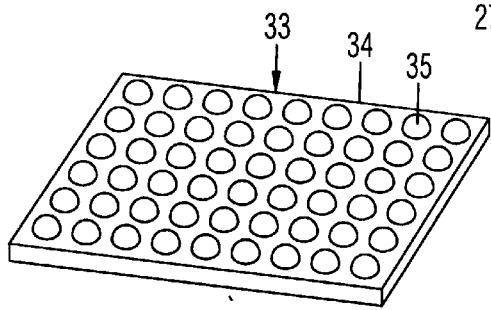
FIG. 7 is a side perspective view of a fourth embodiment of the heat absorbent device.

A fourth embodiment of a heat absorbent device 33 is shown in a front perspective view in FIG. 7. It is comprised of a ceiling tile 34 with a plurality of individually sealed hollow chambers 35 each holding a phase change material. Ceiling tile 34 is sized as a direct replacement for conventional ceiling tiles, i.e., either 2 feet×2 feet or 2 feet×4 feet. They are easily installed without altering the appearance of a room, or taking up floor space. Being individually sealed, hollow chambers 35 limit spillage of the phase change material to a very small amount if tile 34 is punctured or otherwise broken. The tile can also be arranged for mounting directly in computer cabinets.

FIG. 8

Figure 8:
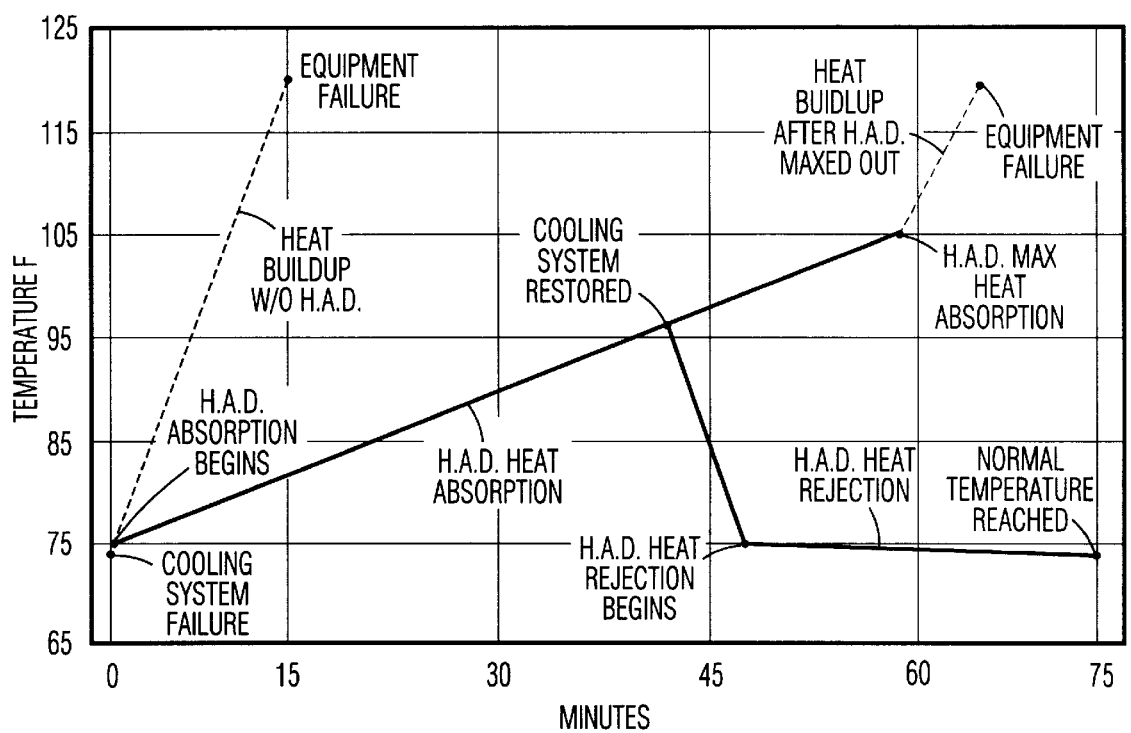
FIG. 8 is a performance graph of the heat absorbent device.

A chart of a preferred minimum performance of the heat absorbent device (H.A.D.) is shown in FIG. 8. It is based on a minimum preferred delay of about 50 minutes for the temperature in a 35 W/ft$^2$ room to rise from about 72° F. to about 120° F. The minimum required amount of a 430 J/ml phase change material melting at about 75° F. is about 500 ml/ft$^2$.

When the cooling system fails at 72° F., and without the heat absorbent device, heat buildup in the 35 W/ft$^2$ room follows a steep curve to the equipment failure temperature of 120° F. in only about 15 minutes. With enough heat absorbent devices providing about 500 ml/ft$^2$ of a 430 J/ml phase change material which melts at about 75° F., heat is absorbed by the heat absorbent devices starting at about 75° F., i.e., passive cooling is provided by the heat absorbent devices. Heat buildup follows a much shallower curve to the maximum heat absorption point of about 105° F., i.e., the point where all of the phase change material is melted. Heat buildup resumes along a steep curve, and reaches about 120° F. after a total of about 65 minutes. The difference between equipment failure without heat absorbent devices and with heat absorbent devices is about 50 minutes. This additional time may be enough to repair the cooling system, or at least shut down the equipment to prevent irreparable damage.

If the cooling system is repaired before maximum heat absorption, the room temperature initially follows a steep curve down, i.e., rapidly drops, to about 75° F. where the phase change material begins to solidify and release stored heat instead of absorbing heat. The room is warmed by the heat absorbent devices, and the temperature follows a shallower curve to the normal room temperature of about 72° F.

SUMMARY AND SCOPE

Accordingly, the present heat absorbent device provides backup cooling in a critical operations room during cooling system failure for providing time to repair the cooling system or shut down the equipment. It cools the room long enough for cooling system repair or equipment shutdown. It is suitable for mounting on different types of structures in a room. It is inexpensive and easy to install. It is also installable without reducing the usable floor area in a room.

Although the above description is specific, it should not be considered as a limitation on the scope of the invention, but only as an example of the preferred embodiment. Many variations are possible within the teachings of the invention. Therefore, the scope of the invention should be determined by the appended claims and their legal equivalents, not by the examples given.

I claim:
1. A heat absorbent device, comprising:
    a container;
    a phase change material received in said container for providing passive cooling;
    a T-bar with a vertical lower portion attached to said container, and a horizontal upper portion for engaging a bottom of a T-rail of a ceiling tile system; and
    a clip attached to said T-bar, said clip for clipping onto said T-rail of said ceiling tile system.
2. The heat absorbent device of claim 1, wherein said container includes a pair of end caps screwed onto opposite ends thereof.
3. The heat absorbent device of claim 1, wherein said phase change material has a melting point of about 75° F. for providing passive cooling in an electronics equipment room during cooling system failure, thus delaying electronics equipment overheating.
4. The heat absorbent device of claim 1, wherein said phase change material is comprised of a stripped ultra coconut fatty acid.
5. The heat absorbent device of claim 1, wherein said phase change material has about 430 J/ml heat absorbency.

* * * * *